US011742363B2

(12) United States Patent
Sreenivasan et al.

(10) Patent No.: US 11,742,363 B2
(45) Date of Patent: Aug. 29, 2023

(54) BARRIER STACKS FOR PRINTED AND/OR THIN FILM ELECTRONICS, METHODS OF MANUFACTURING THE SAME, AND METHOD OF CONTROLLING A THRESHOLD VOLTAGE OF A THIN FILM TRANSISTOR

(71) Applicant: Ensurge Micropower ASA, San Jose, CA (US)

(72) Inventors: Raghav Sreenivasan, Fremont, CA (US); Aditi Chandra, Los Gatos, CA (US); Yoocharn Jeon, San Jose, CA (US)

(73) Assignee: Ensurge Micropower ASA, Oslo (NO)

( * ) Notice: Subject to any disclaimer, the term of this patent is extended or adjusted under 35 U.S.C. 154(b) by 397 days.

(21) Appl. No.: 16/659,871

(22) Filed: Oct. 22, 2019

(65) Prior Publication Data

US 2020/0127021 A1    Apr. 23, 2020

Related U.S. Application Data

(60) Provisional application No. 62/748,845, filed on Oct. 22, 2018.

(51) Int. Cl.
*H01L 27/12* (2006.01)
*H01L 21/311* (2006.01)

(52) U.S. Cl.
CPC ...... *H01L 27/1262* (2013.01); *H01L 27/1218* (2013.01); *H01L 21/31111* (2013.01); *H01L 21/31144* (2013.01)

(58) Field of Classification Search
CPC ............. H01L 21/31111; H01L 21/31144
See application file for complete search history.

(56) References Cited

U.S. PATENT DOCUMENTS 5,354,712 A    10/1994    Ho et al.
6,430,458 B1   8/2002     Mosely et al.
(Continued)

FOREIGN PATENT DOCUMENTS

CN    1967876 A       5/2007
JP    2006-173446 A   6/2006
(Continued)

OTHER PUBLICATIONS

Jae K. Jeong, Hyun S. Shin, Se Y. Kwon and Yeon G. Mo; "Thin Film Transistor and Method of Manufacturing the Same"; May 23, 2007; Abstract of CN1967876 (A); http://worldwide.espacenet.com.

(Continued)

*Primary Examiner* — Trang Q Tran
(74) *Attorney, Agent, or Firm* — Andrew D. Fortney; Central California IP Group, P.C.

(57) ABSTRACT

The present disclosure pertains to a barrier stack for thin film and/or printed electronics on substrates having a diffusible element and/or species, methods of manufacturing the same, and methods of inhibiting or preventing diffusion of a diffusible element or species in a substrate using the same. The barrier stack includes a first barrier layer on the substrate, an insulator layer on the first barrier layer, a second barrier layer on the insulator layer in a first region of the substrate, and a third barrier layer on the insulator layer in a second region of the substrate and on the second barrier layer in the first region. Each of the second and third barrier layers has a thickness less than that of the first barrier layer.

10 Claims, 6 Drawing Sheets

(56) References Cited

U.S. PATENT DOCUMENTS

| | | | |
|---|---|---|---|
| 6,765,249 B2 | 7/2004 | Voutsas et al. | |
| 7,470,992 B2 | 12/2008 | Thei et al. | |
| 7,504,336 B2 | 3/2009 | Purtell et al. | |
| 7,868,327 B2 | 1/2011 | Jeong et al. | |
| 8,963,227 B2 | 2/2015 | Lim et al. | |
| 9,299,704 B2 | 3/2016 | Ji et al. | |
| 2002/0058405 A1* | 5/2002 | Huang | H01L 23/5222 438/618 |
| 2002/0190332 A1 | 12/2002 | Lee et al. | |
| 2004/0180481 A1 | 9/2004 | Voutsas et al. | |
| 2004/0201545 A1 | 10/2004 | Yamazaki et al. | |
| 2005/0255616 A1 | 11/2005 | Childs et al. | |
| 2006/0110618 A1 | 5/2006 | Manivannan et al. | |
| 2007/0108472 A1 | 5/2007 | Jeong et al. | |
| 2007/0235777 A1 | 10/2007 | Nagata | |
| 2007/0246735 A1 | 10/2007 | Yahata et al. | |
| 2007/0262401 A1* | 11/2007 | Yokoyama | G01L 9/0073 257/E29.324 |
| 2007/0273515 A1 | 11/2007 | MacKenzie et al. | |
| 2007/0287237 A1 | 12/2007 | Rockenberger et al. | |
| 2009/0085095 A1 | 4/2009 | Kamath et al. | |
| 2009/0095818 A1 | 4/2009 | Smith et al. | |
| 2009/0109035 A1 | 4/2009 | Subramanian et al. | |
| 2010/0051328 A1 | 3/2010 | Tain et al. | |
| 2010/0123582 A1 | 5/2010 | Smith et al. | |
| 2010/0296225 A1 | 11/2010 | Smith et al. | |
| 2014/0091909 A1 | 4/2014 | Smith et al. | |
| 2016/0343668 A1* | 11/2016 | Huang | H01L 21/76834 |

FOREIGN PATENT DOCUMENTS

| | | |
|---|---|---|
| KR | 100383756 B1 | 5/2003 |
| KR | 10-0669774 B1 | 10/2007 |
| TW | 200304695 | 10/2003 |
| TW | 200805670 | 1/2008 |
| WO | 2010138766 A1 | 12/2010 |

OTHER PUBLICATIONS

Matsunari, Shuichi; "Optical Element for Extreme Ultraviolet Ray, and Projection Aligner Using the Same"; Abstract of JP2006173446; http://worldwide.espacenet.com.

Shin, Hyun Soo et al.; "Flat Panel Display and Method for Manufacturing the Same"; May 24, 2006; Bibliographic data for KR20060055621; http://worldwide.espacenet.com.

International Search Report and Written Opinion; International Searching Authority dated Jan. 9, 2020 International Application No. PCT US2019/057359; 9 pages; International Searching Authority/ United States, Commissioner for Patents, Alexandria, Virginia.

* cited by examiner

BARRIER STACKS FOR PRINTED AND/OR THIN FILM ELECTRONICS, METHODS OF MANUFACTURING THE SAME, AND METHOD OF CONTROLLING A THRESHOLD VOLTAGE OF A THIN FILM TRANSISTOR

CROSS REFERENCE TO RELATED APPLICATION(S)

This application claims the benefit of U.S. Provisional Patent Application No. 62/748,845, filed on Oct. 22, 2018, incorporated herein by reference as if fully set forth herein.

FIELD OF THE INVENTION

The present invention generally relates to the field(s) of thin-film and/or printed transistors (TFTs). More specifically, embodiments of the present invention pertain to a barrier stack for thin film and/or printed electronics, such as metal-oxide-semiconductor field-effect transistors (MOSFETs), on substrates having diffusible elements and/or species, structures adapted to control a threshold voltage ($V_t$) of a thin film and/or printed p-channel metal-oxide-semiconductor (PMOS) transistor, methods of manufacturing the same, and methods of controlling a $V_t$ and/or inhibiting or preventing diffusion of a diffusible element or species in a substrate using the same.

DISCUSSION OF THE BACKGROUND

Wireless communication tags, such as RFID and/or security tags, may include labels with thin film and/or printed electronics. Such electronics may comprise an integrated circuit including a plurality of transistors (e.g., MOSFETs) and may be manufactured using printed and/or thin film doped polysilicon processing.

P-channel TFTs may have a threshold voltage ($V_t$) of 0 volts. When manufactured using thing film or printed processing, this $V_t$ value may lead to high transistor off-state leakage, which impacts product performance and (where applicable) battery life. The possible causes of the high off-state leakage may include possible impurities and defects in the materials used to manufacture the TFT, dangling bonds, and possibly properties of the material used to form the source, drain and channel of the p-channel TFT. It is generally believed that the causes of off-state leakage in thin film and/or printed transistors is not circuit-related.

Unlike conventional complementary metal-oxide-semiconductor (CMOS) manufacturing processes on monolithic Si substrates, printed and thin film doped polysilicon processing may not include channel doping for $V_t$ modulation. Thus, it can be difficult or impossible to control the $V_t$ of certain TFTs.

Figure 1:
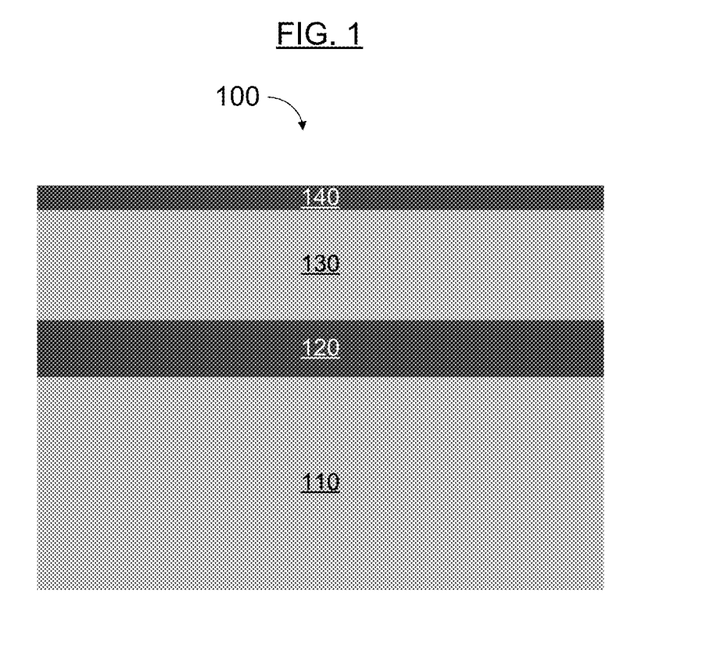
FIG. 1 shows a conventional barrier stack on a stainless steel substrate.

FIG. 1 shows a conventional substrate with a barrier stack 100 comprising a stainless steel substrate 110, a thick AlN layer 120, an aluminosilicate insulator layer 130, and a thin AlN layer 140. The stainless steel substrate 110 provides a mechanical support for layers subsequently formed on it, but includes a number of diffusible elements or species, including iron and chromium atoms. The AlN layers 120 and 140 inhibit or prevent metal atoms from diffusing into structures (e.g., transistor channels) subsequently formed on or over the AlN layer 140.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

In one aspect, the present invention relates to a device, comprising a substrate containing a diffusible element and/or species, a first barrier layer on the substrate, an insulator layer on the first barrier layer, a second barrier layer on the insulator layer in a first region of the substrate, and a third barrier layer on the insulator layer in a second region of the substrate and on the second barrier layer in the first region. Each of the second and third barrier layers has a thickness less than that of the first barrier layer.

In various embodiments, the substrate may comprise a metal foil. The metal foil may comprise stainless steel, aluminum, copper or titanium. In other or further embodiments, the first region is an NMOS transistor region, and the second region is a PMOS transistor region. In such embodiments, the device may further comprise a plurality of p-channel thin film transistors on the third barrier layer in the second region and a plurality of n-channel thin film transistors on the third barrier layer in the first region.

In some embodiments, the first barrier layer, the second barrier layer and the third barrier layer may independently comprise AlN, TiN, TiAlN, WN, or TiWN. In other or further embodiments, the first barrier layer may have a thickness of from 500 to 2000 Å, the second barrier layer may have a thickness of from 50 to 200 Å, and/or the third barrier layer may have a thickness of from 50 to 200 Å. In some examples, the second barrier layer and the third barrier layer have a combined thickness that is less than that of the first barrier layer.

In various embodiments, the insulator layer may comprise $SiO_2$, $Al_2O_3$, or an aluminosilicate. Any of the insulator layer materials may be doped with boron and/or phosphorus. The insulator layer may have a thickness of from 2000 to 15,000 Å. In further embodiments, the device comprises a plurality of first regions and a plurality of second regions, and the insulator layer includes a trench or recess in the second region.

In another aspect, the present invention relates to a method of manufacturing a barrier stack on a substrate, comprising forming, in sequence, a first barrier layer, an insulator layer, and a second barrier layer on a substrate containing a diffusible element and/or species, selectively removing the second barrier layer in one or more regions of the substrate, and blanket-depositing a third barrier layer in the one or more regions and on the second barrier layer in remaining region(s) of the substrate. The second barrier layer has a thickness less than that of the first barrier layer. In some embodiments, the method may further comprise forming p-channel thin film transistors in the one or more regions, and forming n-channel thin film transistors in the remaining region(s) of the substrate.

In some embodiments, selectively removing the second barrier layer in the one or more regions of the substrate may expose the insulator layer in the region(s), and blanket depositing the third barrier layer may include blanket-depositing the third barrier layer on the exposed insulator layer. In other embodiments, selectively removing the second barrier layer may include removing an amount of the second barrier layer equal to about half the thickness of the second barrier layer. In further embodiments, the second barrier layer may comprise a first thin barrier layer, an insulator layer, and a second thin barrier layer, and selectively removing the second barrier layer may include removing the insulator layer and the second thin barrier layer in the one or more regions. For example, the second barrier layer may be selectively removed using laser ablation.

In other or further embodiments, the method may further comprise partially etching the insulator layer to form a trench or recess, and forming a blocking mask in the remaining region(s) of the substrate prior to selectively removing the second barrier layer in the one or more regions. Alternatively, the method may further comprise oxidizing the second barrier layer in the one or more regions of the substrate to form an oxidized barrier layer, and selectively etching the oxidized barrier layer and the insulator layer to form the trench or recess. In further embodiments, the method may further comprise removing the blocking mask prior to blanket-depositing the third barrier layer. The blocking mask may be formed by blanket-depositing a photoresist and patterning the photoresist using photolithography.

In various embodiments, the first barrier layer, the second barrier layer, and the third barrier layer may independently comprise AlN, TiN, TiAlN, WN, or TiWN. In other or further embodiments, the substrate may comprise a metal foil, which can be selected from stainless steel, aluminum, copper or titanium. In some embodiments, the insulator layer may comprise $SiO_2$, $Al_2O_3$, or an aluminosilicate, any of which may be doped with boron and/or phosphorus.

In various embodiments, the first barrier layer, the insulator layer, and/or the second barrier layer are formed using blanket deposition. The first barrier layer may have a thickness of from 500 to 2000 Å. The insulator layer may have a thickness of from 2000 to 15,000 Å. The second barrier layer may have a thickness of from 50 to 200 Å. The third barrier layer may have a thickness of from 50 to 200 Å.

In other aspects, the present invention relates to a method of manufacturing a barrier stack, comprising forming, in sequence, a first barrier layer, an insulator layer, and a second barrier layer on a substrate containing a diffusible element and/or species, forming a blocking mask in one or more first regions of the substrate, and thinning the second barrier layer in the one or more first regions of the substrate without thinning the second barrier layer in one or more second regions of the substrate. The second barrier layer has a thickness less than that of the first barrier layer.

An ideal $V_t$ for p-channel field effect transistors (PFETs) is about −0.5 V, since the leakage current may be lowered by orders of magnitude at an operating voltage of 0 V ($V_{dd}$). To solve the above problem (leakage current in PFETs at a $V_t$ of about 0 V), altering the thickness of the topmost AlN layer (e.g., the thin AlN layer 140 shown in FIG. 1) can modulate (i.e., increase or decrease) the amount of charge in the barrier layer stack, thus changing the electric field within the PFET channel. Using a blocking mask scheme, the thickness of the uppermost AlN layer can be varied between the NMOS transistor regions and the PMOS transistor regions to enable a reduction in the $V_t$ of the PMOS transistors.

These and other advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures and components have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

For the sake of convenience and simplicity, the terms "mounting," "affixing," "attaching" and "securing" (and grammatical variations thereof) may be used interchangeably, as may the terms "wireless communication tag" and "wireless communication device," the terms and the terms "fabric" and "textile," but these terms are generally given their art-recognized meanings.

The term "length" generally refers to the largest dimension of a given 3-dimensional structure or feature. The term "width" generally refers to the second largest dimension of a given 3-dimensional structure or feature. The term "thickness" generally refers to a smallest dimension of a given 3-dimensional structure or feature. The length and the width, or the width and the thickness, may be the same in some cases (e.g., cylindrical structures such as optical fibers and certain other optical waveguides). A "major surface" refers to a surface defined by the two largest dimensions of a given structure or feature, which in the case of a structure or feature having a partially or completely circular or spherical surface, may be defined by the radius of the circle or sphere.

Figure 2A:
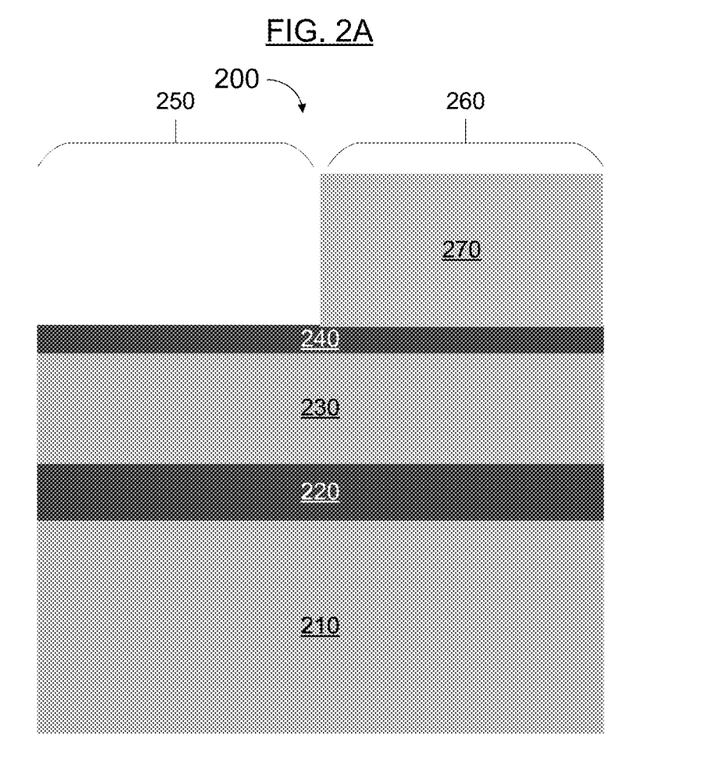
FIGS. 2A-E show cross-sections of intermediate and final barrier stacks, made in accordance with one or more exemplary embodiments of the present invention.
Figure 2B:
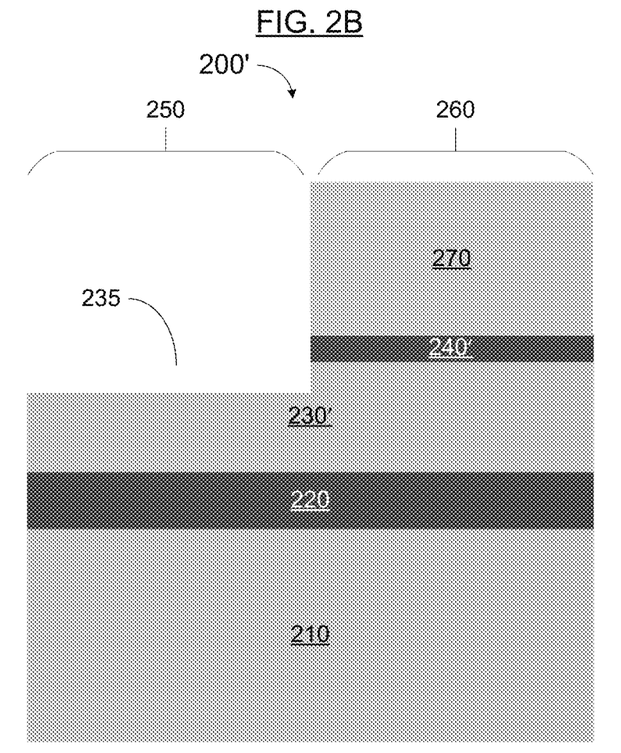
Figure 2C:
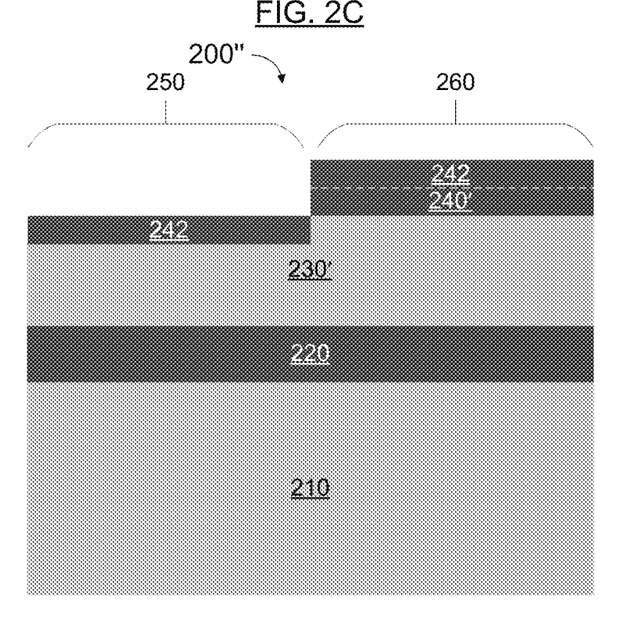

FIGS. 2A-C show the steps of an exemplary method of forming a substrate with a barrier stack 200. FIG. 2A shows the barrier stack 200 an initial state. The barrier stack 200 comprises a substrate 210, a first barrier layer 220, an insulator layer 230, and a second barrier layer 240. The substrate 210 provides a mechanical support for layers subsequently formed thereon. The insulator layer 230 electrically insulates subsequently formed electrically active structures from the substrate 210 (e.g., when the substrate 210 comprises an electrically conductive material, such as stainless steel or aluminum foil). The first and second barrier layers 220 and 240 inhibit or prevent diffusible elements or species from diffusing into the subsequently formed structures.

The substrate 210 may comprise a metal foil such as stainless steel, aluminum, titanium, copper, etc. The insulator layer 230 may comprise $SiO_2$, $Al_2O_3$, or an aluminosilicate, any of which can be doped with boron and/or phosphorus. The first and second barrier layers 220 and 240 may comprise AlN, TiN, TiAlN, WN, or TiWN. The first barrier layer 220 may be thicker than the second barrier layer 240. For example, the first barrier layer 220 may have a thickness of from 500 to 2000 Å, the insulator layer 230 may have a thickness of from 2000 to 15000 Å, and the second barrier layer 240 may have a thickness of from 50 to 200 Å. Each of the first barrier layer 220, the insulator layer 230 and the second barrier layer 240 may be formed by blanket deposition on the substrate 210 (and, optionally, additional processing, such as thermally reflowing the insulator layer 230, to make each surface smoother after the deposition step). A blocking mask 270 is formed in NMOS transistor regions 260 by blanket deposition (e.g., spin coating) and photolithographic patterning, thus exposing PMOS transistor regions 250. In an alternative embodiment, the blocking mask 270 may be selectively formed in the NMOS transistor regions 260 by printing (e.g., screen printing).

In FIG. 2B, the second barrier layer 240 and the insulator layer 230 are etched in the PMOS transistor regions 250 to form an etched barrier stack 200'. The second barrier layer 240 in the PMOS transistor regions 250 is removed, thus forming an etched and/or patterned second barrier layer 240' that remains in the NMOS transistor regions 250 and elsewhere (e.g., peripheral regions of the substrate 210). The insulator layer 230 is only partially etched or recessed, thus forming an etched insulator layer 230' and a trench or recess 235. The trench or recess 235 may have a depth of from 100 to 500 Å, or of from 5 to 50% of the thickness of the insulator layer 230. The blocking mask 270 is then stripped and/or removed (e.g., by ashing and cleaning).

In FIG. 2C, a third barrier layer 242 is blanket-deposited on the etched and unmasked barrier stack 200". The third barrier layer 242 is blanket-deposited in the trench or recess 235 (on the upper surface of the etched insulator layer 230') and on the etched second barrier layer 240' (e.g., in the NMOS regions 260). The third barrier layer 242 may have a thickness of from 50 to 200 Å (e.g., about 75 Å). Thus, the uppermost layer of the barrier stack 200" may include (i) the third barrier layer 242 alone in the PMOS transistor regions 250 and (ii) the combined second and third barrier layers 240' and 242 in the NMOS transistor regions 260. The combined second and third barrier layers 240' and 242 may have a thickness that is 1.2 to 5 times greater than the thickness of the third barrier layer 242 alone. The barrier stack 200" is configured to lower the $V_t$ of the p-channel TFTs subsequently formed in the PMOS transistor regions 250.

Figure 2D:
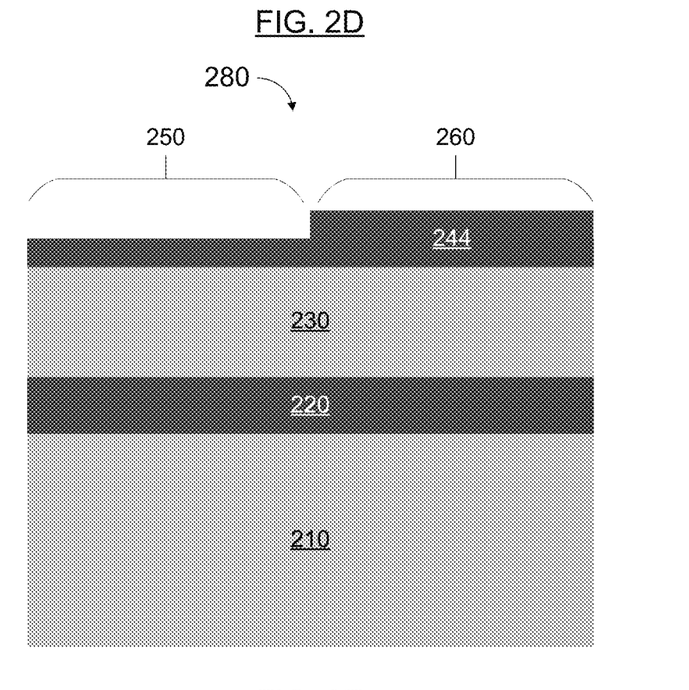

In an alternative embodiment, FIG. 2D shows a barrier stack 280 including a partially etched barrier layer 244 on the insulator layer 230. The blocking mask (e.g., the mask 270 shown in FIG. 2A) may be formed in the NMOS transistor regions 260 (e.g., using photolithography). The thin barrier layer 244 may have an original thickness of from, e.g., 100 to 500 Å, and the exposed portions of the thin barrier layer 244 in the PMOS transistor regions 250 may be partially etched to a depth of from 25 to 200 Å (e.g., 75 Å), or 5 to 75% (e.g., 50%) of the original thickness, thus forming the barrier stack 280. The partially etched barrier layer 244 may have a thickness of from 50 to 400 Å (e.g., 150 Å) in the PMOS transistor regions 250, and has its original thickness in the NMOS transistor regions 260. The blocking mask may then be stripped and/or removed (e.g., by ashing and cleaning). For example, the portions of the barrier layer 244 in the PMOS transistor regions 250 may have a thickness of from 25 to 200 Å (e.g., 75 Å), and the portions of the barrier layer 244 in the NMOS transistor regions 260 may have a thickness of from 50 to 400 Å (e.g., 150 Å).

Figure 2E:
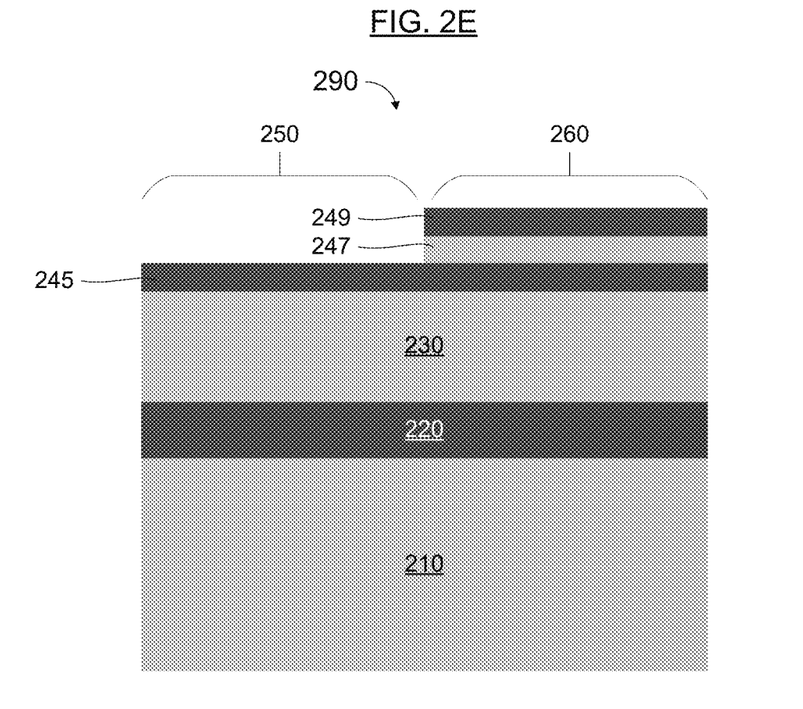

In another alternative embodiment, FIG. 2E shows a barrier stack 290 comprising a trilayer. The trilayer comprises a first thin barrier layer 245, an $SiO_2$ or other insulator layer 247 (e.g., an etch stop layer), and a second thin barrier layer 249. The first and second thin barrier layers 245 and 249 may comprise AlN, TiN, TiAlN, WN, or TiWN. Each of the thin barrier layers 245 and 249 and the $SiO_2$ layer 247 may each have a thickness of from 50 to 200 Å. For example, the barrier layers 245 and 249 may each have a thickness of 75 Å and the insulator layer 247 may have a thickness of 50 Å. The exact thicknesses of the first and second thin barrier layers 245 and 249 depend on the material(s) of the first and second thin barrier layers 245 and 249 and the desired $V_t$ and/or amount of $V_t$ adjustment in the PMOS transistor regions 250.

The blocking mask (e.g., the mask 270 shown in FIG. 2A) may be formed in the NMOS transistor regions 260 as described herein. The portions of the second thin barrier layer 249 in the PMOS transistor regions 250 may be completely and selectively etched (e.g., removed), stopping at the insulator layer 247. The insulator layer 247 in the PMOS transistor regions 250 is then completely and selectively etched, stopping at the first thin barrier layer 245. The second thin barrier layer 249 can be selectively etched with respect to the insulator layer 247. The insulator layer 247 can then be selectively etched with respect to the first thin barrier layer 245. The selective etch chemistries for etching the second thin barrier layer 249 and the insulator layer 247 are known, but depend on the specific materials of the second thin barrier layer 249, the insulator layer 247 and the first thin barrier layer 245. Thus, the embodiment exemplified in FIG. 2E provides a barrier stack 290 with the first thin barrier layer 245 in the PMOS transistor regions 250 and the trilayer (comprising the thin barrier layers 245 and 249 and the insulator layer 247) in the NMOS transistor regions 260.

In yet another alternative embodiment, the second barrier layer 240 (FIG. 2A) may have a thickness of from 50 to 200 Å (e.g., 75 Å) across the entire device, and the second (thin) barrier layer 240 in the PMOS transistor regions 250 may be selectively laser ablated, without laser ablating the second (thin) barrier layer 240 or using the blocking mask 270 in the NMOS transistor regions 260. For example, the laser ablation of the second barrier layer 240 in the PMOS transistor regions 250 may be conducted until it is completely removed. The third barrier layer 242 is then blanket-deposited on the insulator layer 230 in the PMOS transistor regions 250 and the remaining portion of the second barrier layer 240 in the NMOS transistor regions 260, resulting in the third barrier layer 242 alone in the PMOS transistor regions 250 and a combination of the second and third barrier layers 240 and 242 in the NMOS transistor regions 260. The third barrier layer 242 alone may have a thickness of from 50 to 200 Å (e.g., 75 Å), and the second and third barrier layers 240 and 242 together may have a combined thickness of from 100 to 400 Å (e.g., 150 Å).

Figure 3A:
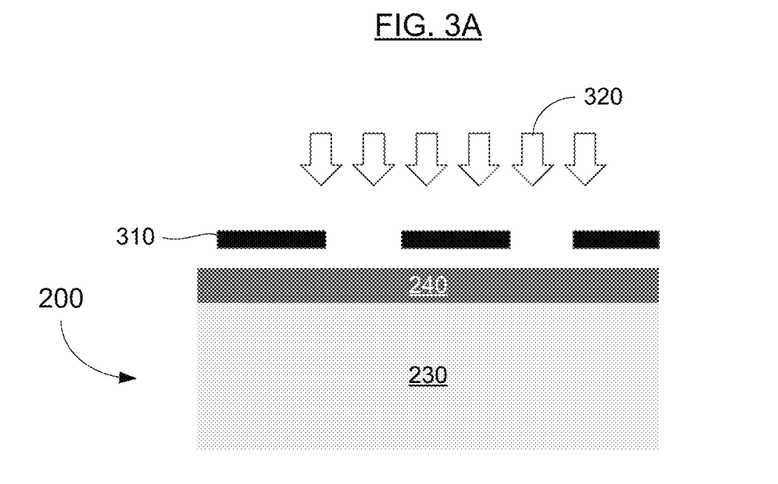
FIGS. 3A-C show cross-sections of intermediate and final barrier stacks in an exemplary method using a plasma treatment step, in accordance with one or more exemplary embodiments of the present invention.
Figure 3B:
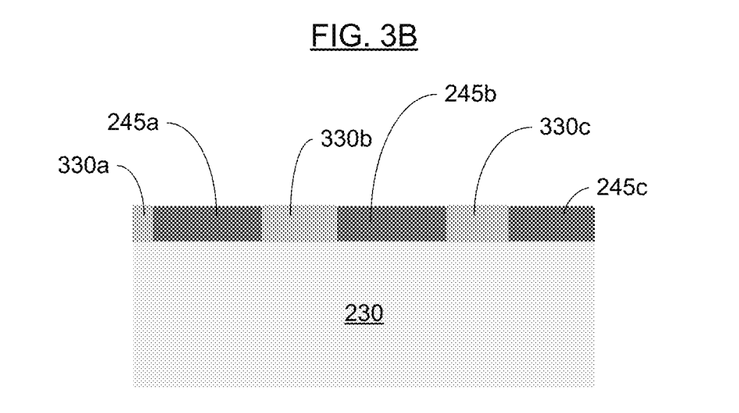
Figure 3C:
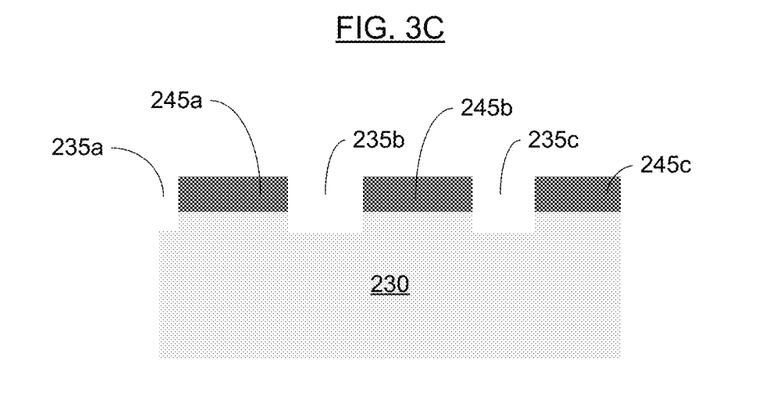

FIGS. 3A-C show cross-sections of intermediate and final products in an exemplary method of forming trenches or recesses 235*a-c* in the barrier stack 200 using an oxygen plasma 320. The second barrier layer 240 and the insulator layer 230 are shown, and are similar or identical to the structures described with respect to the barrier stack 200 in FIG. 2A. The first barrier layer 220 and the substrate 210 (not shown) are under the insulator layer 230, as shown in FIG. 2A.

In FIG. 3A, the oxygen plasma 320 converts regions of the second barrier layer 240 exposed through a shadow mask 310 to a different material that can be selectively etched with respect to the barrier layer 240. For example, if the second barrier layer 240 comprises a metal nitride (e.g., AlN), the exposed regions of the second barrier layer 240 may be oxidized to the corresponding metal oxide (e.g., $Al_2O_3$). The source of the oxygen plasma 320 may include oxygen ($O_2$) and/or ozone ($O_3$) at a flow rate of from 0.01 to 1 sccm, but other gases (e.g., a nitrogen oxide, such as $NO_2$, NO or $N_2O$) may be used as well. An RF power of from 100 to 2000 W may be applied to electrodes in the plasma processing equipment to form the plasma 320. The plasma 320 may be formed and the oxidation conducted at a temperature of from room temperature to 700° C.

In FIG. 3B, the mask 310 is removed, and the oxidized portions 330*a-c* of the second barrier layer 245*a-c* are selectively etched (e.g., by wet etching). The etchant may include dilute and/or buffered KOH, NaOH, or ammonium hydroxide. The etching may be performed at a temperature of from room temperature to about 100° C. and for a duration of time sufficient to remove the oxidized portions 330*a-c* without substantially removing the second barrier layer 245*a-c*. Optionally, the barrier stack 200 may be overetched such that part of the insulator layer 230 is removed. For example, the insulator layer 230 may be etched to a depth of from 5% to 50% of the thickness of the insulator layer 230.

In FIG. 3C, the oxidized portions 330*a-c* are completely removed, and the insulator layer 230 is partially etched, to form trenches or recesses 235*a-c* (e.g., similar or identical to the trench or recess 235 in FIG. 2B). The trenches or recesses 235*a-c* may have a depth of from 100 to 500 Å, or of from 5 to 50% of the thickness of the insulator layer 230. The third barrier layer 242 may then be deposited in the trenches or recesses 235*a-c* and on the second barrier layer 245*a-c*, as shown in FIG. 2C.

Figure 4A:
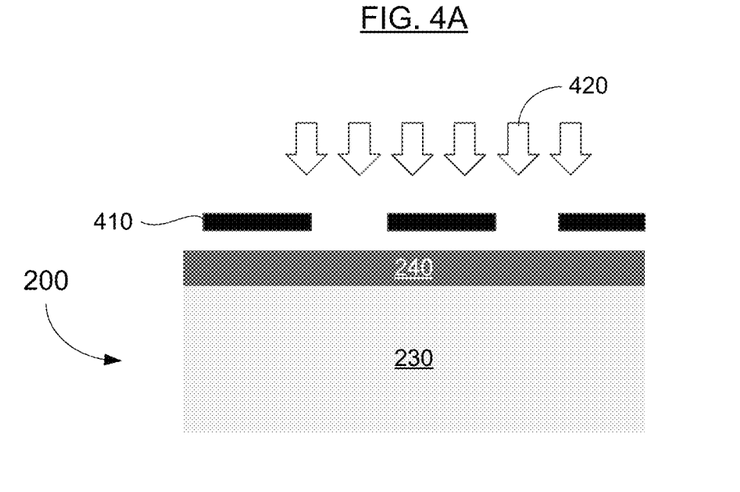
FIGS. 4A-C show cross-sections of intermediate and final barrier stacks in an exemplary method using a deposition step, in accordance with one or more exemplary embodiments of the present invention.
Figure 4B:
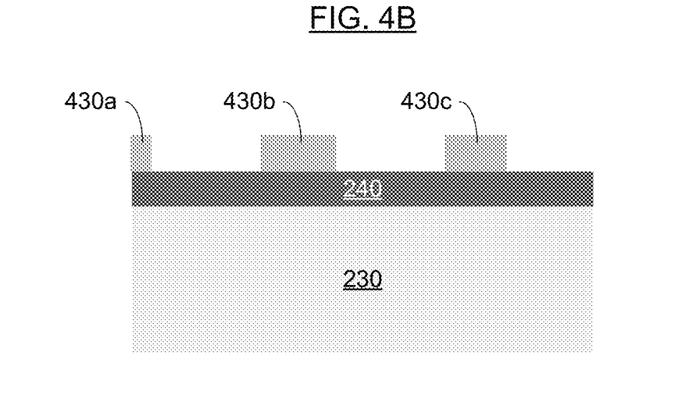
Figure 4C:
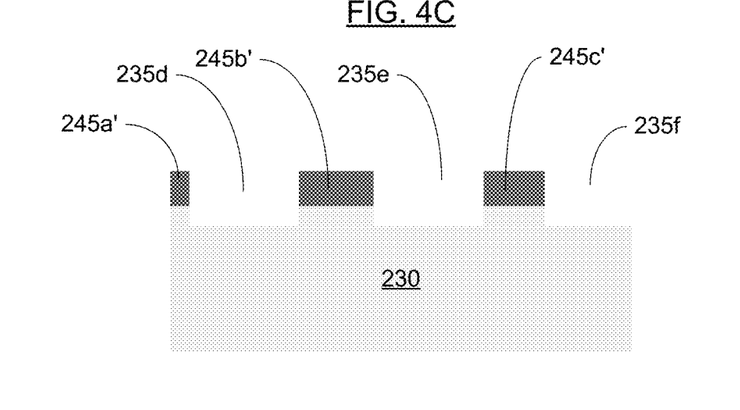

FIGS. 4A-C show cross-sections of intermediate and final products in an exemplary method of forming trenches or recesses 435*a-c* in the barrier stack 200 using a shadow mask 410 and a selective deposition process 420. The second barrier layer 240 and the insulator layer 230 are shown, and are similar or identical to the structures described with respect to the barrier stack 200 in FIG. 2A. The first barrier layer 220 and the substrate 210 (not shown) are under the insulator layer 230, as shown in FIG. 2A.

In FIG. 4A, an ink 420 for an etching mask is deposited on regions of the second barrier layer 240 exposed through the shadow mask 410. The ink 420 may comprise a carbon-based (e.g., olefinic) resist or other polymer, and may be deposited by screen printing through the shadow mask 410. After selective deposition, the mask 410 may be removed and the ink 420 may be hardened or cured conventionally (e.g., by heat and/or radiation).

FIG. 4B shows a patterned mask 430*a-c* formed by the deposited and hardened or cured ink 420 for a subsequent etching step. The regions of the second barrier layer 240 that are exposed by the islands 430*a-c* (e.g., the regions that were covered by the shadow mask 410 in FIG. 4A) are selectively etched. The etchant may include a wet etchant such as dilute KOH, NaOH, or ammonium hydroxide, but is not limited thereto. The etching may be performed at a temperature of from room temperature to about 100° C. and for a duration of time sufficient to remove the regions of the second barrier layer 240 that are exposed by the islands 430*a-c* without substantially removing the mask 430*a-c*. Optionally, the barrier stack 200 may be overetched such that part of the insulator layer 230 is removed.

In FIG. 4C, the regions of the second barrier layer 240 that are exposed by the islands 430*a-c* are completely etched, and the insulator layer 230 is partially etched, to form the trenches or recesses 235*d-f* (e.g., similar or identical to the trench or recess 235 in FIG. 2B). The trenches or recesses 235*d-f* may have a depth of from 100 to 500 Å, or of from 5 to 50% of the thickness of the insulator layer 230. The third barrier layer 242 may then be deposited in the trenches or recesses 235*d-f* and on the second barrier layer 245*a'-c'*.

Figure 5:
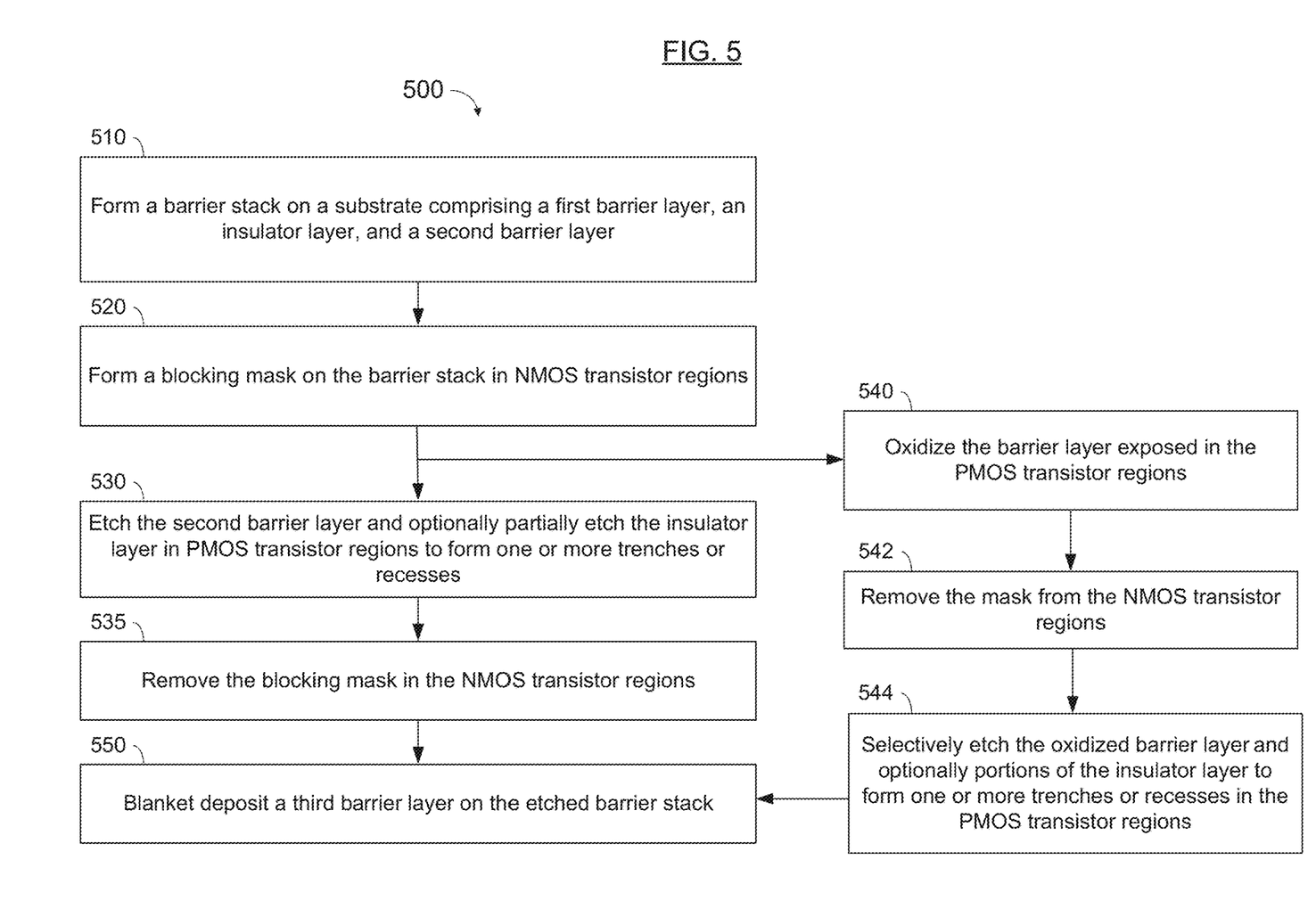
FIG. 5 is a flow chart showing a method of forming a barrier stack on a substrate, in accordance with embodiments of the present invention.

FIG. 5 is a flow chart 500 showing exemplary methods of forming a barrier stack on a substrate. At 510, a barrier stack is formed on the substrate, generally by blanket deposition. The barrier stack comprises a first barrier layer, an insulator layer, and a second barrier layer as described herein. The substrate may comprise a metal foil such as stainless steel, copper, aluminum, titanium, etc. The first and second barrier layers may comprise a metal nitride such as AlN, TiN, TiAlN, WN, or TiWN, or a metal alloy such as TiW. The insulator layer may comprise $SiO_2$, $Al_2O_3$, or an aluminosilicate, any of which may be doped with boron and/or phosphorus. The second barrier layer has a thickness that is less than that of the first barrier layer.

At 520, a blocking mask is formed in NMOS transistor regions of the barrier stack. The blocking mask may be formed by blanket-depositing a photoresist and patterning the photoresist using photolithography. Alternatively, the patterned photoresist may be formed by printing (e.g., screen printing). After forming the patterned photoresist, the method may proceed in one of two alternative paths. The first path includes steps 530, 535 and 550, and the second path includes steps 540, 542, 544 and 550.

If the first path is chosen, at 530, the second barrier layer is etched, and optionally, the insulator layer is partially etched in the PMOS transistor regions to form one or more trenches or recesses. The etchant may be a wet etchant such as dilute KOH, NaOH, or ammonium hydroxide. The etch may be performed at a temperature of from room temperature to about 100° C. and for a duration of time sufficient to remove the exposed portions of the second barrier layer. At 535, the blocking mask is removed from the NMOS transistor regions. The blocking mask may be removed by ashing and cleaning (e.g., using high temperatures and oxygen to burn or combust the mask, then removing remaining residue from the etched surface of the barrier stack).

If the second path is chosen, at 540, the regions of the second barrier layer exposed in the PMOS transistor regions of the substrate are oxidized using an oxygen plasma. For example, if the second barrier layer comprises a metal nitride (e.g., AlN), the exposed regions of the second barrier layer may be oxidized to the corresponding metal oxide (e.g., $Al_2O_3$). The source of the oxygen plasma may include oxygen gas ($O_2$) or ozone gas ($O_3$). The oxygen plasma may be at room temperature or heated to a temperature of up to 700° C. using electrodes having an RF power of from 100 to 2000 W. The oxygen plasma may have a flow rate of from 0.01 to 1 sccm.

At 542, the blocking mask is removed from the NMOS transistor regions. The blocking mask may be removed by ashing and cleaning (e.g., using high temperatures to combust the mask and blowing the dust off the surfaces of the barrier stack).

At 544, the oxidized portions of the second barrier layer are selectively wet etched to form one or more trenches or recesses (e.g., similar or identical to the trench or recess 235 in FIG. 2B). The etchant may include dilute KOH, NaOH, or ammonium hydroxide. The etching may be performed at room temperature or a temperature up to about 100° C. and a duration of time sufficient to remove the oxidized portions without substantially removing the second barrier layer. The trenches or recesses may have a depth of from 100 to 500 Å, or of from 5 to 50% of the thickness of the insulator layer. Alternatively, the blocking mask may be removed after the oxidized barrier layer is etched.

At 550, a third barrier layer may be deposited in the trenches or recesses formed in the PMOS transistor regions of the substrate and on the second barrier layer in the NMOS transistor regions of the substrate. The third barrier layer may be substantially similar or identical to the second barrier layer with regard to thickness and material.

CONCLUSION

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of manufacturing a barrier stack, comprising:
 forming, in sequence, on a substrate comprising a metal foil and containing a diffusible element and/or species, a first barrier layer, an insulator layer, and a second barrier layer, wherein the second barrier layer has an original thickness less than the first barrier layer;
 forming a blocking mask in one or more first regions of the substrate; and
 thinning the second barrier layer in the one or more first regions of the substrate without thinning the second barrier layer in one or more second regions of the substrate, wherein the second barrier layer in the one or more first regions of the substrate has a final thickness that is 5 to 75% of the original thickness after thinning.

2. The method of claim 1, wherein the insulator layer comprises an $SiO_2$, $Al_2O_3$, or an aluminosilicate, any of which may be doped with boron and/or phosphorus.

3. The method of claim 1, wherein the first barrier layer, the insulator layer, and the second barrier layer are formed using blanket deposition.

4. The method of claim 1, wherein the first barrier layer and the second barrier layer independently comprise AlN, TiN, TiAlN, WN, or TiWN.

5. The method of claim 1, wherein the insulator layer comprises an $SiO_2$, $Al_2O_3$, or an aluminosilicate, any of which may be doped with boron and/or phosphorus.

6. The method of claim 1, wherein the insulator layer has a thickness of from 2000 to 15,000 Å, the first barrier layer has a thickness of from 500 to 2000 Å, and the second barrier layer has a thickness of from 100 to 500 Å.

7. The method of claim 1, wherein the metal foil comprises stainless steel, copper, aluminum, or titanium.

8. The method of claim 7, wherein the first barrier layer and the second barrier layer independently comprise AlN, TiN, TiAlN, WN, or TiWN.

9. The method of claim 8, wherein the insulator layer comprises an $SiO_2$, $Al_2O_3$, or an aluminosilicate, any of which may be doped with boron and/or phosphorus.

10. The method of claim 9, wherein the insulator layer has a thickness of from 2000 to 15,000 Å, the first barrier layer has a thickness of from 500 to 2000 Å, and the second barrier layer has a thickness of from 100 to 500 Å.

* * * * *